United States Patent [19]

Gwozdz et al.

[11] Patent Number: 4,605,470

[45] Date of Patent: Aug. 12, 1986

[54] METHOD FOR INTERCONNECTING CONDUCTING LAYERS OF AN INTEGRATED CIRCUIT DEVICE

[75] Inventors: Peter S. Gwozdz, Cupertino; Hubert M. Bath, Saratoga, both of Calif.

[73] Assignee: Advanced Micro Devices, Inc., Sunnyvale, Calif.

[21] Appl. No.: 743,205

[22] Filed: Jun. 10, 1985

[51] Int. Cl.[4] .................. B44C 1/22; C03C 15/00; C03C 25/06; B29C 17/08

[52] U.S. Cl. .................. 156/643; 29/578; 29/591; 156/644; 156/646; 156/653; 156/657; 156/659.1; 156/668; 204/192 E; 357/71; 427/90

[58] Field of Search ........ 252/79.1; 204/164, 192 EC, 204/192 E; 118/728, 50.1, 620; 427/38, 39, 427/88–91, 93, 95; 430/313, 317; 156/643, 644, 646, 156/653, 655, 656, 657, 659.1, 661.1, 662, 668; 357/65, 71; 29/578, 591

[56] References Cited

U.S. PATENT DOCUMENTS

| | | | |
|---|---|---|---|
| 4,451,326 | 5/1984 | Gwozdz | 156/653 X |
| 4,470,874 | 9/1984 | Bartush et al. | 156/646 X |
| 4,481,070 | 11/1984 | Thomas et al. | 156/643 |
| 4,523,975 | 6/1985 | Groves et al. | 156/657 X |

Primary Examiner—William A. Powell
Attorney, Agent, or Firm—Patrick T. King; John P. Taylor; J. Vincent Tortolano

[57] ABSTRACT

An improved method for forming a conductive path through at least one layer of insulating material in an integrated circuit structure comprising a narrow portion and a sloped oversized portion of the conductive path. The method comprises forming the sloped oversize portion of the conductive path by defining an opening in a layer of photoresist material applied over the layer of insulating material, sloping the edges of the photoresist layer adjacent the opening to define an angle with the plane of the underlying insulating layer, and etching the photoresist layer and the insulating layer with an etchant capable of removing both materials to form the sloped oversized portion of the conductive path. The narrow portion of the conductive path is formed by etching at least a portion of the insulating layer to expose a selected section of the integrated circuit structure below the insulating layer. Either the oversized sloped portion or the narrow portion may be formed first. Planarization can be carried out prior to formation of the conductive path and/or during formation of the oversized sloped portion.

39 Claims, 25 Drawing Figures

METHOD FOR INTERCONNECTING CONDUCTING LAYERS OF AN INTEGRATED CIRCUIT DEVICE

BACKGROUND OF THE INVENTION

1. Field of the Invention

This invention relates to the manufacture of integrated circuit devices. More particularly, this invention relates to an improved method for forming sloped interconnects or vias between conducting layers separated by insulating layers.

2. Description of the Prior Art

Conducting layers, separated by insulating layers in an integrated circuit device, are electrically connected together using interconnects or vias which pass through the insulating layer. In its simplest form, such a via may be formed by first masking the insulating layer with photoresist and then selectively etching a portion of the insulating layer, through an opening formed in the photoresist using well known photolithographic techniques, to form an opening to the underlying conducting layer. An anisotropic etch may be used to form a hole having the same size as the opening in the photoresist or an isotropic etch may be used to provide a larger opening through undercutting of the photoresist mask opening.

After etching the opening, the photoresist layer is removed and a layer of conducting material, such as aluminum, is then deposited over the insulating layer. The conducting material also deposits in the via to form the electrical interconnect between the conducting layers.

While this method of forming a via is satisfactory when the opening is sufficiently large and the insulating layer is thin, complications can arise when a thicker insulating layer and/or a smaller size via is formed. The use of a thick insulating layer, while preferred from the standpoint of lower capacitance between conducting layers, results in the formation of a larger step as well as unacceptable thinning of the conducting layer adjacent the edge of the via. Smaller size vias, while desirable to decrease via pitch, can result in incomplete filling of the via with conducting material causing formation of voids or defects.

Previous attempts to prevent such problems from occurring included the use of a sloped sidewall via; for example, by the use of an etch capable of attacking the insulating layer/photoresist interface; or, for example, by the use of a layer between the insulating layer and the photoresist layer comprising a material capable of etching faster than the insulating material.

Oversize vias have been used in the prior art for defect protection. Typically, an opening conforming to the desired size of the via is etched through the insulating layer and then a second layer of insulating material is applied over the first layer. The second insulating layer is then masked and anisotropically etched to form a larger via generally in registry with the smaller via underneath. The amount of etching is controlled to remove only an amount of insulating material generally conforming to the amount deposited to form the second insulating layer, both to control the depth of the oversized via as well as to remove from the bottom of the smaller underlying via any insulating material deposited during formation of the second insulating layer.

The use of a thick insulating layer, or multiple insulating layers, however, can also result in the formation of larger steps. This can result in the need for planarization of the insulating layer prior to deposition of a conducting layer thereon. Gwozdz U.S. Pat. No. 4,451,326, assigned to the assignee of this invention, describes and claims a method for planarization wherein a sufficient amount of photoresist is deposited over an insulating layer having steps therein to fill in the low spots. The layers are then etched using an etchant which will remove both photoresist and the insulating material at about the same rate. This results in the removal of insulating material from the high spots while photoresist is removed from the low areas to thus smooth out the step upon subsequent removal of the photoresist material.

Thomas et al U.S. Pat. No. 4,481,070, also assigned to the assignee of this invention, describes and claims a double planarization method wherein a first insulating layer is planarized and a second insulating layer is then applied over the first layer and then also planarized.

While such prior art approaches to via construction included solutions to some of the problems encountered, unfortunately other problems were sometimes created by such solutions. For example, the formation of sloped vias in the prior art suffers from variable growth in via size. This is due to a combination in the variation in the slope angle of from 30 to 60 degrees and the need to overetch to assure completion of the etch in spite of manufacturing variations. For example, if the slope angle is 30 degrees, and the amount of overetch is 14%, the amount of growth in the via size can be shown to be 49% of the thickness of the insulating layer.

When planarization techniques, such as described above, are utilized, thickness of the insulating layer may vary over a wider range, thus further expanding the range of possible via size when forming sloped vias. For example, a typical 1 micron thick insulating layer may actually vary in thickness from 0.9 to 1.1 microns. With planarization, however, typical deposition thicknesses are 2.0 microns, typical resist thickness is 1.0 micron with 5% random variation, and typical planarization etches are performed with 10% random variation to leave 1.0 micron of insulating material. Therefore, with planarization, the range of thickness of the insulating layer, calculated by taking the square root of the squares of the independent variables, will be from 0.7 to 1.3 microns.

Furthermore, as the size of the integrated circuit devices continue to decrease and the density of the integration continues to increase, the use of many vias requires decreasing the via pitch to space the vias as close together as possible. Via pitch is defined as the via separation plus via size. Generally via size and via size tolerance enter the design consideration in such a way that larger vias and larger via tolerance both increase pitch. Hence the increased via sizes and increased tolerances due to prior art planarization and slope etching techniques lead to increased pitch and therefore a disadvantage.

Thus in the prior art, the formation of vias without the use of slopes or oversize vias could result in the formation of voids or trenches, as well as step coverage problems if a thick insulating layer is used; while higher capacitance can result from the use of a thinner insulating layer. When sloped vias or oversized vias are used, via pitch is negatively impacted, particularly if planarization techniques are also used to reduce the step formation.

SUMMARY OF THE INVENTION

It is therefore an object of the invention to provide an improved method of forming a via to interconnect conducting layers in an integrated circuit structure.

It is another object of the invention to provide an improved method of forming a sloped via to interconnect conducting layers in an integrated circuit structure which may be used with either a thin or a thick insulating layer.

It is yet another object of the invention to provide an improved method of forming a sloped via to interconnect conducting layers in an integrated circuit structure which may be used in conjunction with planarization techniques.

It is a further object of the invention to provide an improved method of forming a sloped via to interconnect conducting layers in an integrated circuit structure which permits the formation of a sloped via while reducing the variation in via dimension whereby the via pitch will not be as limited by variations in via size.

These and other objects of this invention will become apparent from the description and accompanying drawings.

In accordance with a preferred embodiment of the invention, an improved method of connecting conductive layers in an integrated circuit structure comprises forming a via and a sloped oversized via in an insulating layer previously formed over a conductive layer. The sloped via is formed by first defining an opening in a photoresist layer applied over the insulating layer and then sloping the photoresist by, for example, baking the photoresist layer at a temperature sufficient to cause the edges of the photoresist layer adjacent the opening to flow until the edges are smooth and define an angle with the plane of the underlying insulating layer. The photoresist and the insulating layer are then etched with an etchant capable of removing both materials to form the desired sloped oversized via.

DESCRIPTION OF THE PREFERRED EMBODIMENTS

Figure 1:
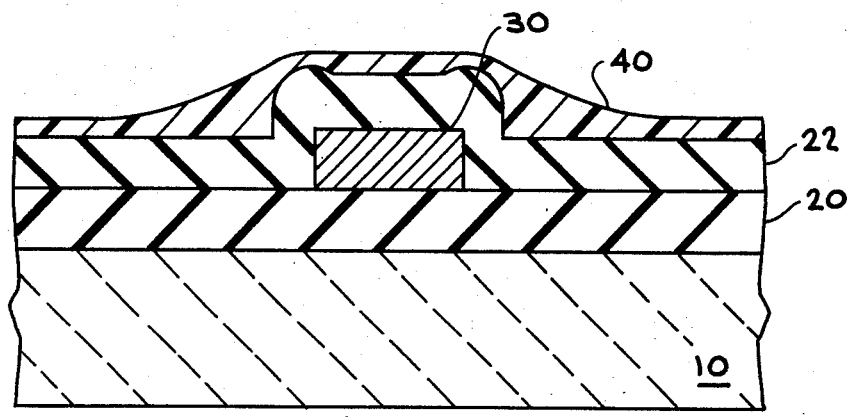
FIGS. 1-3 are fragmentary cross section views of an integrated circuit structure illustrating the construction of the structure at early stages in the practice of the method of the invention.
Figure 2:
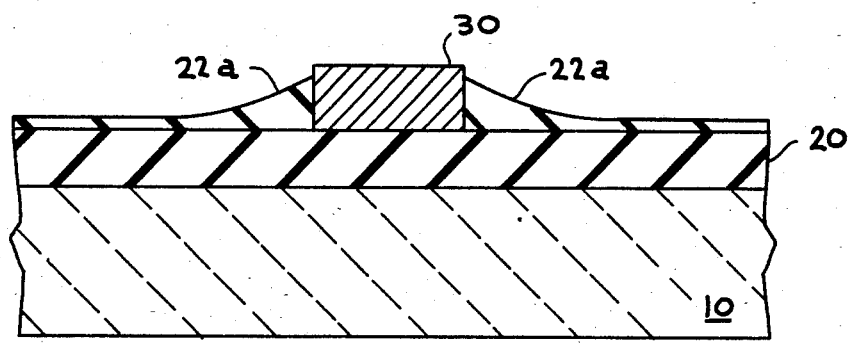

Referring now to FIG. 1, one embodiment of the method of the invention is illustrated. A conductor 30 has been previously placed on an insulating layer 20 which layer 20 has been previously applied on a substrate 10. An insulating layer 22 is placed over layer 20 and conductor 30. A photoresist layer 40 is then applied, for example, by spin application. This structure of FIG. 1 is then etched in an etchant capable of etching photoresist layer 40 and insulating layer 22 at about the same rate, to produce the structure of FIG. 2 having fillets 22a adjacent conductor 30. The structure up to this point represents prior art practices.

Figure 3:
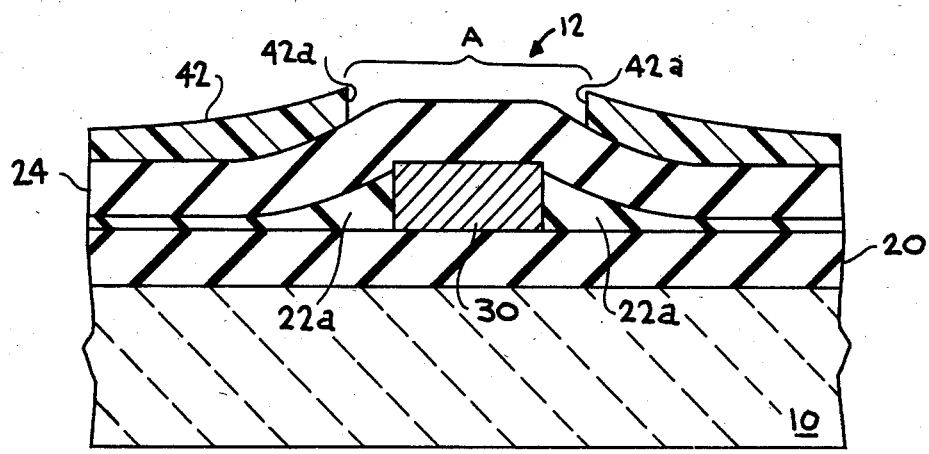

Referring now to FIG. 3, another insulating layer 24 is then applied, and a photoresist layer 42 is placed over layer 24. An oversized via 12 of width A is imaged and developed in photoresist layer 42.

Figure 4:
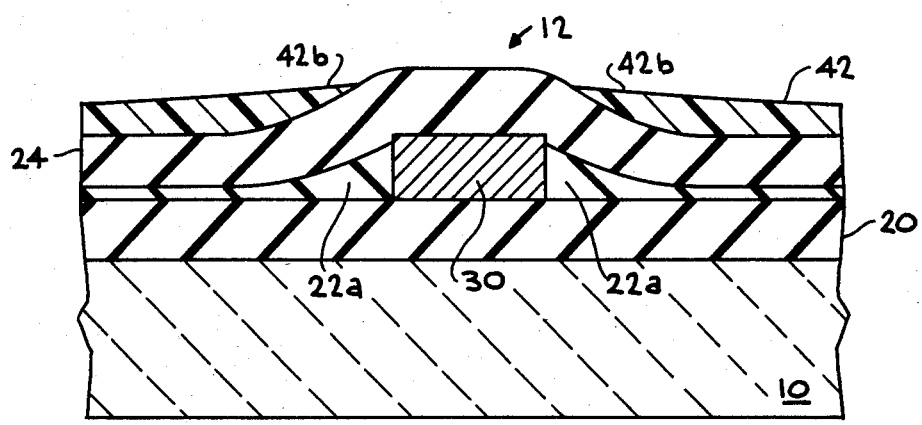
FIG. 4 is a fragmentary cross section of the same integrated circuit structure after formation of the sloped oversized via.

In accordance with the invention, the edges 42a of photoresist layer 42 forming via 12 are sloped, for example, by baking at a temperature of from 100° to 200° C., preferably about 185° C., for a period of time sufficient to cause photoresist layer 42 to flow to form the sloped edges 42b of the oversized via 12 illustrated in FIG. 4.

The structure is now etched in an etchant, for example, the same etchant used above, to etch photoresist layer 42 and insulator layer 24 at about the same rate. The etch time is chosen to be sufficient to etch away all of insulator layer 24 above the conductor 30 in the region of oversized via 12 leaving regions 24a adjacent conductor 30 as illustrated in FIG. 5.

Figure 5:
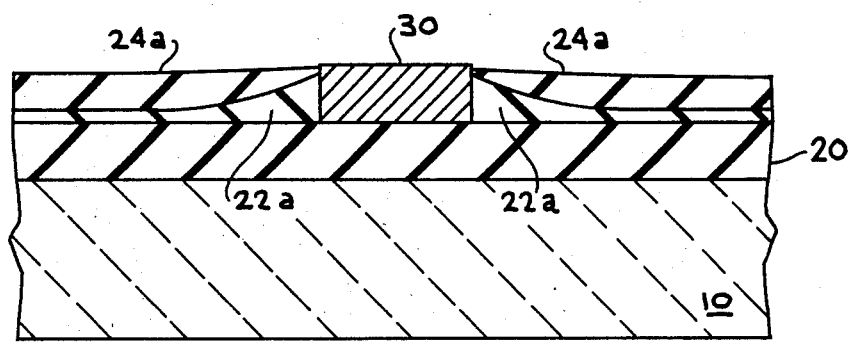
FIGS. 5-7 are fragmentary cross sectional views of subsequent stages in the practice of the method of the invention.

FIG. 5 illustrates the case where insulating layer regions 24a are about the same thickness as conductor 30. According to the invention, insulating regions 24a may be thinner or thicker than conductor 30.

Figure 6:
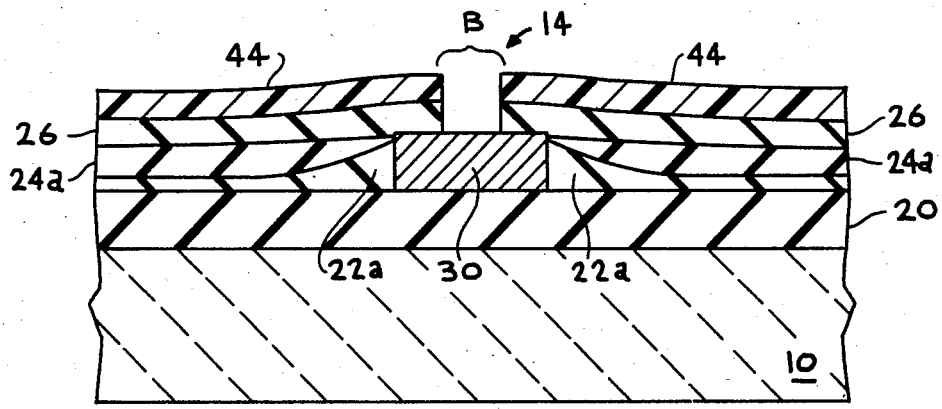

Next, a further insulating layer 26 is deposited, and a via 14, having a width B, is defined using photoresist layer 44, as illustrated in FIG. 6, using an anisotropic etch as is well known in the prior art. The thickness of insulating layer 26 is chosen to be thin enough so that the sides of via 14 are easily covered by subsequent deposition of conductive material. For example, insulating layer 26 is preferably about 0.5 microns thick. Photoresist layer 44 is removed after formation of via 14. Finally a second conductor 34 is then deposited and patterned to connect to conductor 30 through the via 14, as illustrated in FIG. 7.

The via sidewall step is precisely controlled by the thickness of the relatively thin insulating layer 26. The coverage of this step by conductor 34 is thereby controlled. The problem of the prior art with step coverage is prevented without the attendant problems of a sloped via.

Figure 7:
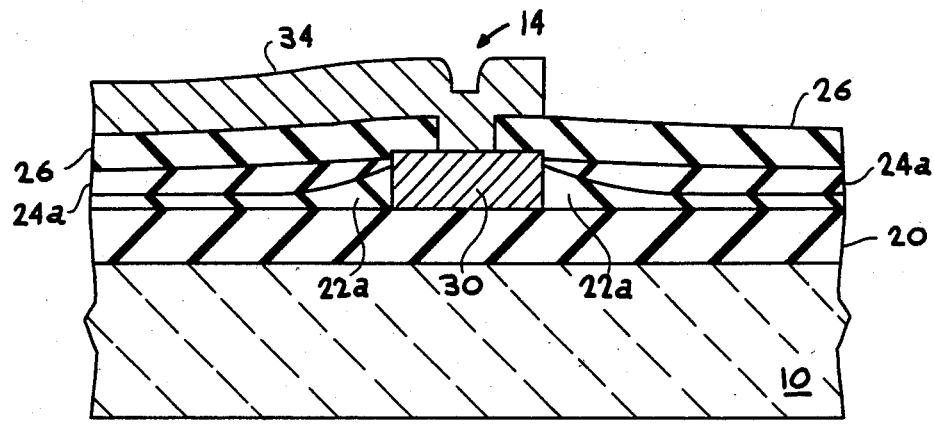

The insulation layer 24a can be relatively thick, as much as 5 microns or more, in the final structure of FIG. 7. The thick insulation layer offers the advantage of lowered capacitance between the conductive layers 30 and 34 in regions where large areas of the conductive layers overly each other. Lower capacitance produces faster circuits which is an advantage.

Figure 8:
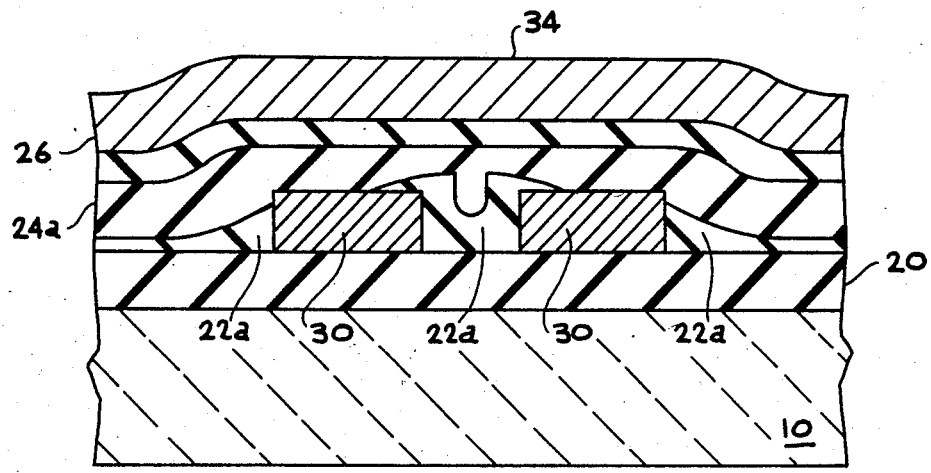
FIG. 8 is a fragmentary cross sectional view illustrating the method of the invention as practiced on a structure having lead thicknesses comparable to the spacing between the leads.

Adjacent narrow leads of conductor 30 are filleted at 22a by insulating layer 22, thereby avoiding trenching problems when the thickness of conductor 30 is comparable to the spacing of the leads, as illustrated in FIG. 8.

Figure 9:
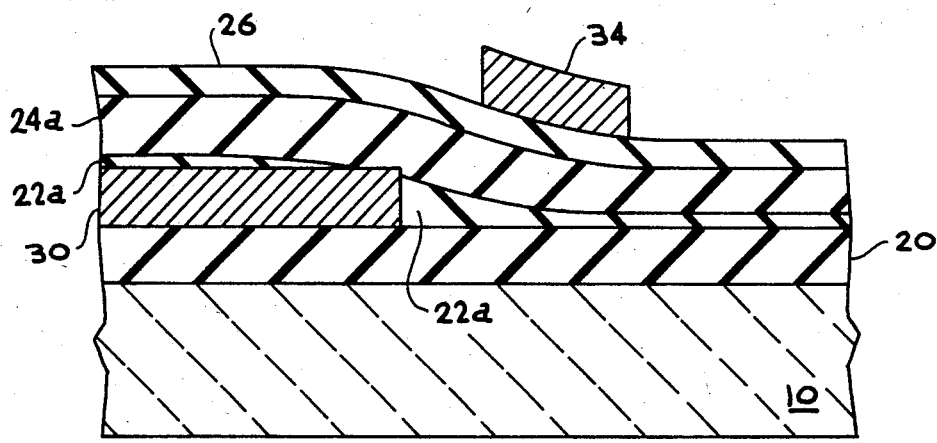
FIG. 9 is a fragmentary cross sectional view illustrating the practice of the method of the invention when applying more than one conductor layer.

The edges of conductor 30 are smoothed, so that subsequent lithography of conductor 34 is easy and precise, as illustrated in FIG. 9.

Figure 10:
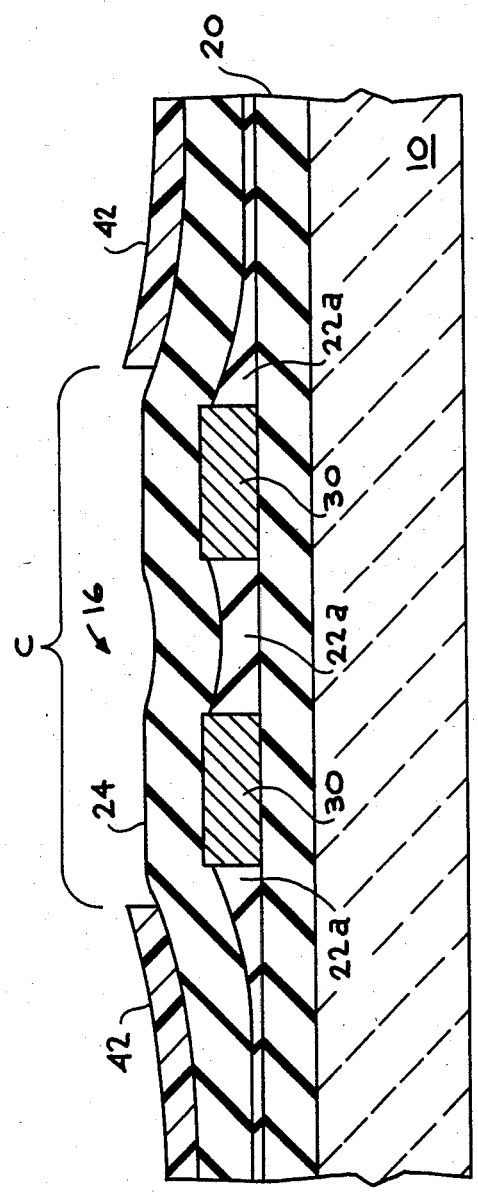
FIGS. 10 and 11 are fragmentary cross sectional views illustrating the practice of the method of the invention using a common oversized via to produce a fine pitch of adjacent conductors.
Figure 11:
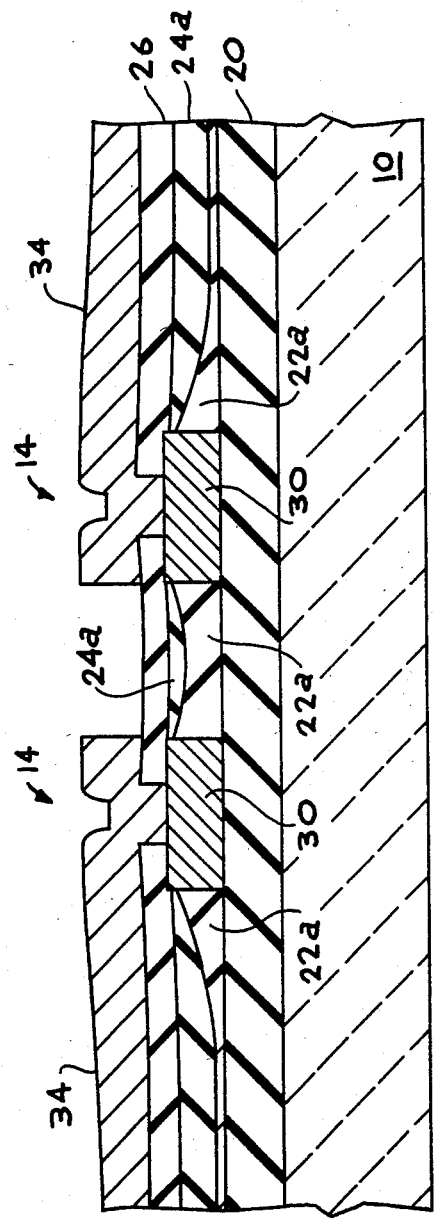

Vias can be placed close together to produce a fine pitch of connected conductors, as illustrated in FIGS. 10 and 11. FIGS. 10 and 11 correspond to a region of an integrated circuit with two adjacent vias. FIG. 10 corresponds to the stage of fabrication after definition of the oversized via, as in FIG. 3. FIG. 11 corresponds to the final product, as in FIG. 7. Common oversized vias such as via 16 of width C in FIG. 10 are easily formed using conventional computer aided design as widely practiced in the industry, by reproducing the via data base and expanding the vias on the copy, thereby forming merged oversized vias.

Figure 12:
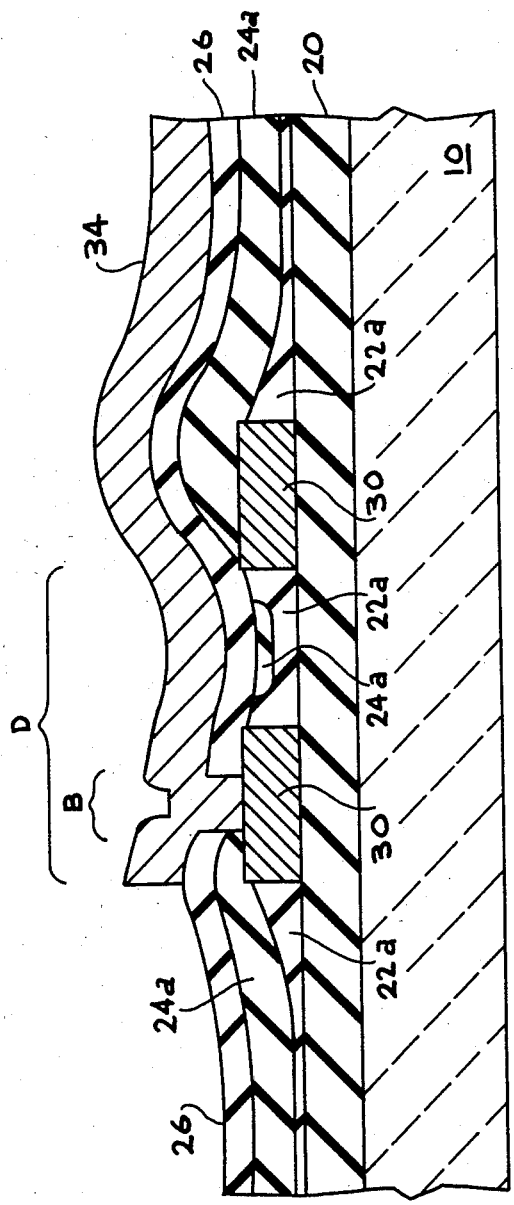
FIG. 12 is a fragmentary cross sectional view illustrating one step in the practice of the method of the invention wherein the sloped oversized via is misaligned and/or oversized.
Figure 13:
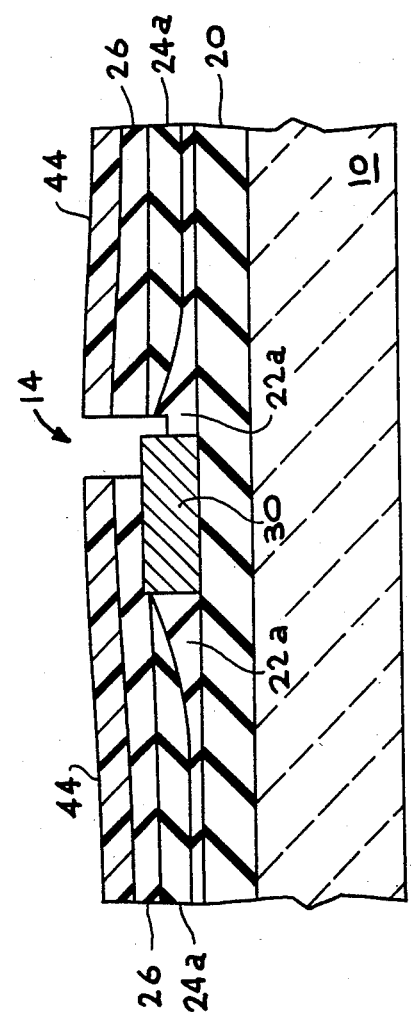
FIG. 13 is a fragmentary cross sectional view illustrating one step in the practice of the method of the invention wherein the via is misaligned and/or oversized.
Figure 14:
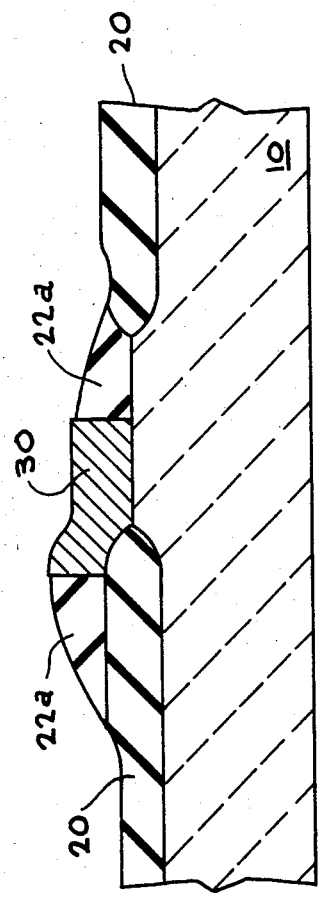
FIG. 14 is a fragmentary cross sectional view illustrating one step in the practice of the method of the invention wherein the conductor is misaligned and/or undersized.

Problems associated with misalignment and dimension control are avoided by the present invention as illustrated in FIGS. 12–14.

In FIG. 12, an oversized via of width D is shown misaligned and/or oversized. Such a marginally processed via may expose adjacent unintended conductor 30 when the sloped via is etched into insulator 24 as illustrated in FIG. 12. Such an exposure is not a problem with the present invention, because insulation layer 26 safely covers such exposure. The choice of about 0.5 microns for insulation layer 26 is sufficient to avoid excessive pinholes. The increased capacitance due to the thinning of the total insulation is not significant because of the small areas involved. In the prior art, it was not possible to slope a via close to an unintended conductor.

In FIG. 13, a misaligned and/or oversized via 14 is illustrated. The etching of via 14 can be precisely controlled due to the thinness of layer 26 and due to the fact that all prior insulators were cleared before layer 26 was deposited. Consequently, the overetch which causes the trench on the edge of conductor 30, illustrated in FIG. 13, can be kept shallow. Overhanging vias, which inadvertently occur during the practice of the invention, therefore, can be safe. In FIG. 14, a misaligned and/or undersized conductor 30 is illustrated. FIG. 14 illustrates the same stage in fabrication as in FIG. 2. FIG. 14 illustrates the case of inadvertant overetch of layer 22. The fillet 22a of insulation layer 22 protects the substrate contact from exposure by the planarization etch which was used to produce the structure of FIG. 14, and also from exposure by the via etch in the case of overhanging vias.

Figure 15:
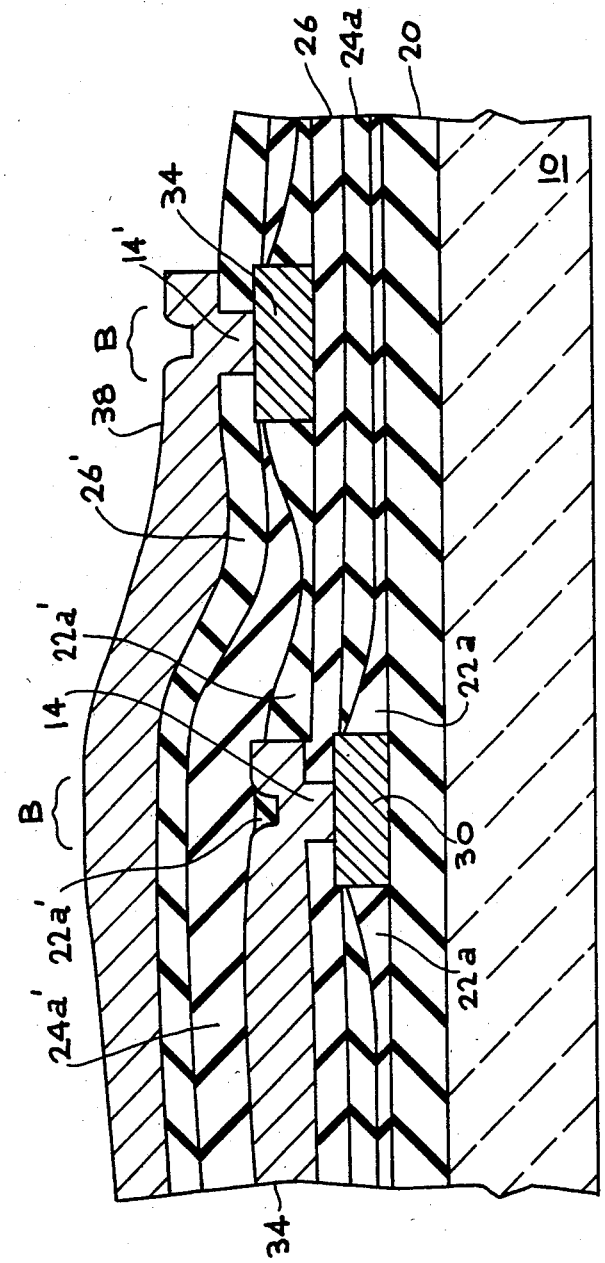
FIG. 15 is a fragmentary cross sectional view illustrating a three conductor layer structure resulting from the practice of the preferred method of the invention.
Figure 16:
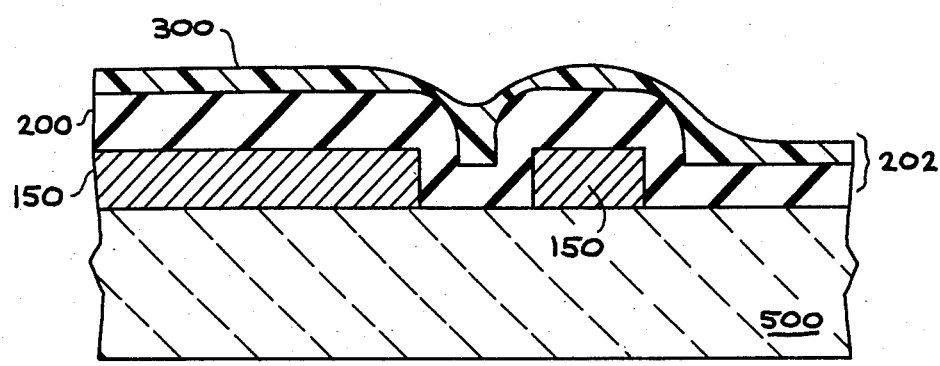
FIGS. 16-25 are fragmentary cross sectional views illustrating the step by step practice of another embodiment of the invention in forming sloped vias in an integrated circuit structure shown having three conducting layers.

This preferred embodiment as illustrated in FIGS. 1–14, describes the use of the present invention to connect two conducting layers. The present invention may also be used to connect three or more conducting layers. The case of three layers is illustrated in FIG. 15. The insulating layer 22a' is fabricated in the same way as layer 22a. The insulating layer 24a' is fabricated in the same way as layer 24a. The insulating layer 26' is fabricated in the same way as layer 26. The via 14' connects conductor 34 to conductor 38 in the same way that via 14 connects conductor 30 to conductor 34. Via 14' is electrically insulated from via 14. Via 14 is the same as the via illustrated in FIG. 7. Again, layer 24a' may be as thick as about 5 microns.

The conductive material used for layers 30, 34, and 38 may, for example, comprise aluminum; an aluminum alloy conductor such as, for example an aluminum alloy consisting essentially of 99.5 wt. % aluminum and 0.5 wt. % copper; or gold; as well as multiple or sandwich layers of one or more of the aforementioned materials with a tungsten alloy barrier layer consisting essentially of 95 wt. % tungsten and 5 wt. % titanium. The use of gold, of course, may be prohibitive from a cost standpoint.

The thickness of the conductive layers will vary depending upon the particular material selected due to the difference in conductivity of the conductive materials. For example, when the above aluminum alloy is used, the thickness may vary from about 0.8 to 2 microns while titanium-tungsten alloy barrier layers are used in a range of from 0.15 to 0.2 microns.

The use of the term "conductive layer" as used herein is further intended to include a silicon layer as when the formation of the conductive path, usually referred to herein as a via, actually comprises the formation of a contact hole to the contact of an active device formed in silicon.

The etchant used should be capable of etching both the photoresist and the insulating materials. Preferably the rate should be about equal although unequal rates, ranging from about 1:2 to 2:1, may be specifically employed to achieve certain desired effects are within the scope of the invention as will be described below. The etchant must also be chosen to not significantly attack the metal conductor. For example, a freon plus oxygen plasma etch may be used or a $CHF_3$ plus $SF_6$ plasma etch may be used.

Either an anisotropic or an isotropic etch may be used, although anisotropic etching may be preferred for small dimension work for better dimension control. The etchant may be either a dry or wet etchant provided that the etchant is capable of etching both the photoresist and insulating materials.

The insulating material, in a preferred embodiment, comprises silicon dioxide doped with about 5 wt. % phosphorus. The insulating material is conveniently formed by the pyrolysis of $SiH_4$ and $PH_3$ at about 360° C. Depending upon the particular application, the thickness of the insulating layers may vary from about 0.3 to about 5 or more microns.

The width of the sloped via will vary depending upon the initial angle of the slope of the photoresist layer after formation, e.g., after baking as well as the initial opening defined in the photoresist layer. As the angle which the slope defines with the horizontal plane of the structure, increases, the overall size of the sloped via will decrease, and vice versa. However, in the practice of this invention, via pitch is not affected because the sloped via is the oversized via. Ideally, the slope will approximate 45 degrees. The slope angle may be controlled by the thickness of the photoresist, the heating temperature and heating time for flowing the photoresist, the flow rate of the particular photoresist material, and the etchant used.

In the preferred embodiment, the sloping of the oversized via is initially formed by baking the photoresist layer at a temperature of from 100° to 200° C. for a time period sufficient to cause the photoresist material to flow to form the desired slope. However, the oversize via slope may be formed in other ways as well which should be deemed to be within the scope of the invention. For example, sloping the edges of the photoresist material adjacent the via opening may comprise defocusing the image of the oversized via during exposure of the photoresist material whereby subsequent development of the photoresist material will result in a sloped edge. Other sloping methods may also be used and are deemed to be within the scope of the practice of this invention such as, for example, using an etch capable of attacking the insulating layer/photoresist interface, or by the use of a layer between the insulating layer and the photoresist layer comprising a material capable of etching faster than the insulating material.

The etch ratio $E_r$ (etch rate of the photoresist material divided by the etch rate of the insulating material) is, ideally 1:1. However, ratios of from 1:2 to 2:1 are usable in the practice of the invention. The thicknesses of the respective layers may have to be adjusted accordingly, however, for differences in etch rates. The etch rate, $E_r$, may be varied by changing the photoresist etch rate of the etchant, for example, when an oxygen/freon etch is used, by varying the concentration of oxygen in the etchant.

This embodiment, in which the oversized via is formed first, is particularly preferred because all of the insulating material over the conductor can be removed, as shown in FIG. 5, no matter how many layers or variations in thickness of such layers were present previous to the etch.

It should be noted, however, that when the method of the invention is used to make oversized sloped contacts directly to a silicon layer, e.g., to active devices such as MOS or bipolar transistors, it is preferred to form the narrow via first, since exposure of the active device by overetching of the oversized sloped via could have a deleterious effect on the active device.

Referring now to FIGS. 16–25, another embodiment of the method of the invention is illustrated wherein the narrow via is formed before forming the sloped via. This embodiment is illustrated in connection with the construction of an integrated circuit structure containing three conducting layers. A 0.8 micron conducting layer 150 comprising, for example, aluminum, is deposited and lithographically defined by conventional methods. A layer 200 of dielectric material such as, for example silicon dioxide, is deposited over the structure. The thickness of dielectric layer 200 (as measured at a point spaced from a step) is 0.7 microns. A photoresist layer 300 is spun over dielectric layer 200 to a thickness of 0.3 microns to provide the structure illustrated in FIG. 16.

Figure 17:
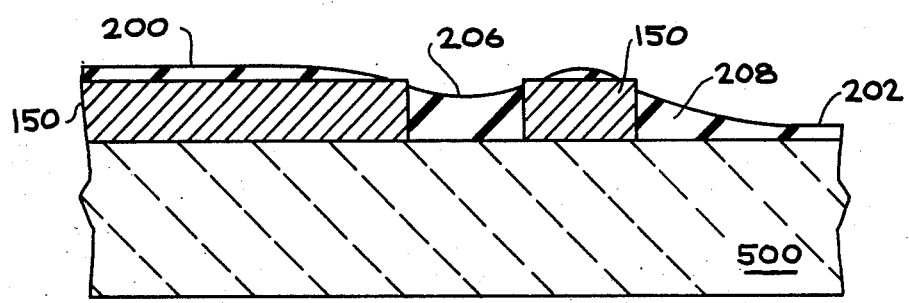

Photoresist layer 300 and insulating layer 200 are now etched to remove a total thickness, at 202 in FIG. 17, of 0.95 microns. This results in a near filling of the space between adjoining conductor portions 150 at 206 in FIG. 17 with fillets 208 of insulating material produced along the outer edge of conductor 150 tapering to the thin portion 202.

Figure 18:
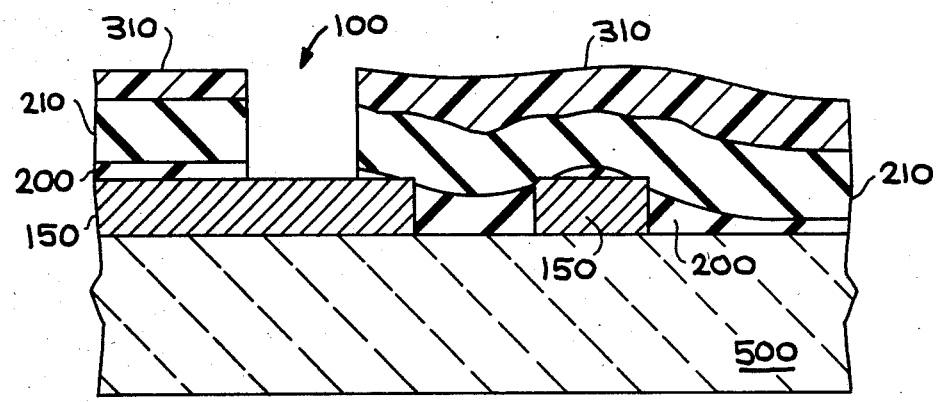

The structure is next cleaned in a photoresist stripper such as, for example, an oxygen plasma as a safety procedure in case some photoresist residue remains. A second insulating layer 210, which may also comprise silicon dioxide, is now deposited to a depth of 1.4 microns. A 1 micron thick photoresist layer 310 is now spun over layer 210 and vias 100 are defined in photoresist 310 and etched through layer 210 and remaining portions of layer 200 as shown in FIG. 18.

Figure 19:
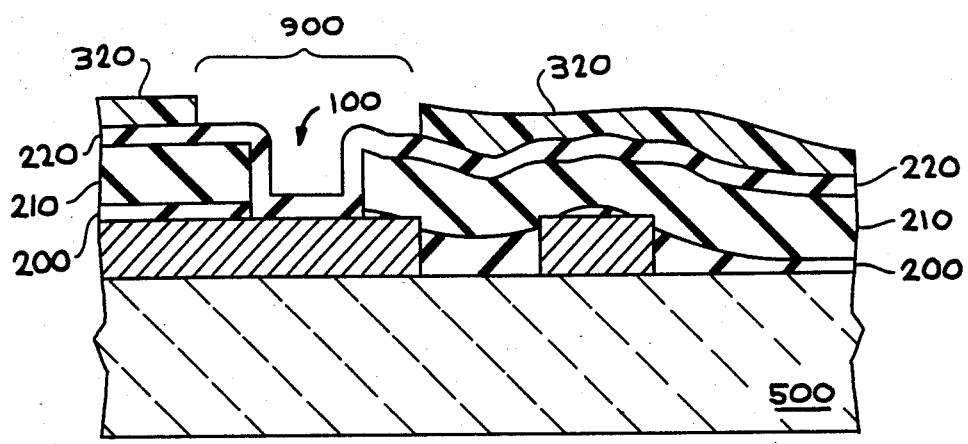

Photoresist 310 is now stripped away and another layer of insulating material 220 applied to a depth of 0.3 microns. A 0.4 micron layer of photoresist 320 is then spun on and oversized vias 900 defined therein as shown in FIG. 19.

In accordance with the invention photoresist 320 is now baked at a temperature of 185° C. to flow the photoresist material at the edges of via 900.

As previously stated, the width of the sloped via will vary depending upon the initial angle of the slope of the photoresist layer after baking as well as the initial opening defined in the photoresist layer. Therefore, when forming the narrow via first, the thickness of photoresist layer 320, the bake time, and the initial size of via 900 are adjusted to provide a spacing at 952 between the bottom of the slope and the side of via 100 of nominally about 1.0 microns as shown in FIG. 20, to avoid introducing photoresist material into the narrow via.

Figure 20:
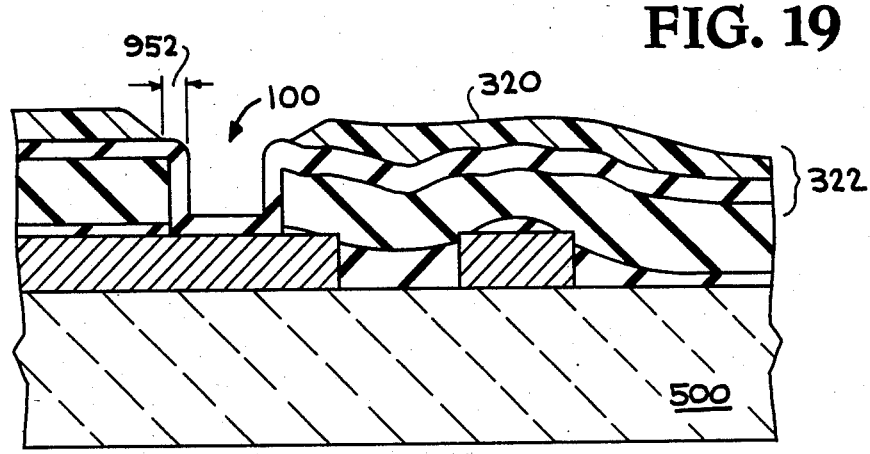
Figure 21:
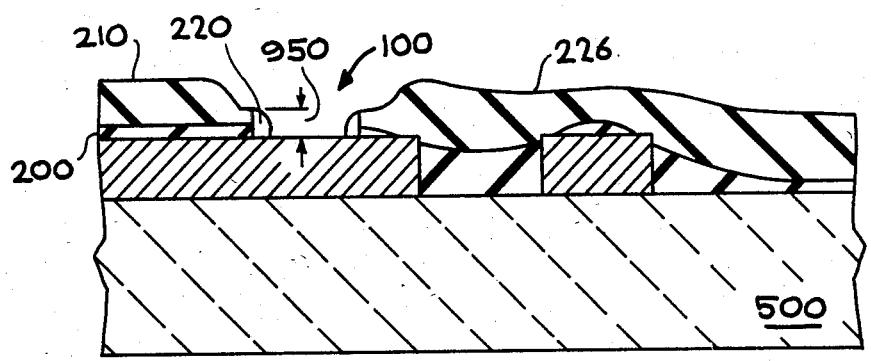

Still referring to FIG. 20, for this particular embodiment of the invention, the structure of FIG. 20 is etched in an etchant such as an oxygen/freon plasma etch which etches insulating material 220 at a rate of about 1.6 times the etch rate of photoresist layer 320. The etch depth at 322 in FIG. 18 is about 1.05 microns. The remaining thickness of insulating layer 220 at 950 between the bottom of the slope of the larger via and the smaller via 100 is about 0.8 microns. Furthermore, all or most of the photoresist layer 320 is eroded and the surface 226, as seen in FIG. 21, is planarized, all in one etch step.

The structure of FIG. 21 is then again cleaned in a photoresist stripper such as an oxygen plasma to remove any remaining photoresist residues. A 0.8 micron conductor layer 450, such as, for example, aluminum, is then deposited. and photolithographically defined by prior art techniques.

Figure 22:
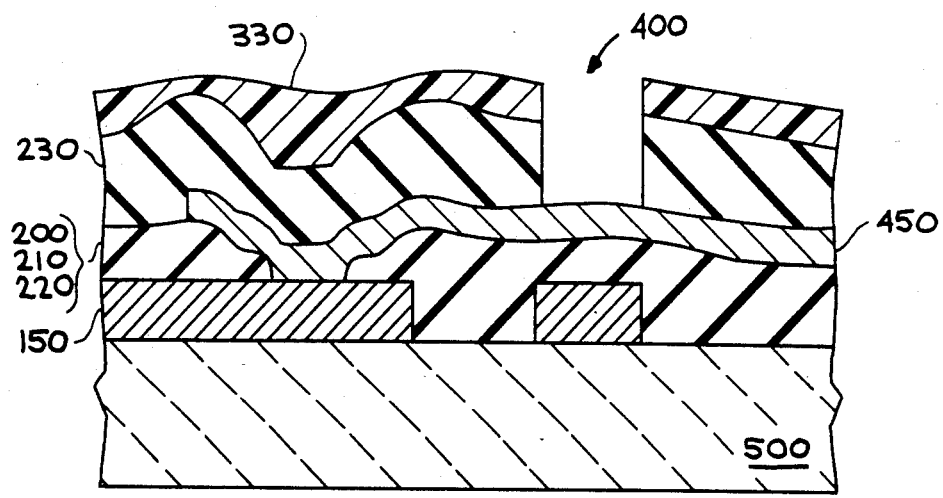
Figure 23:
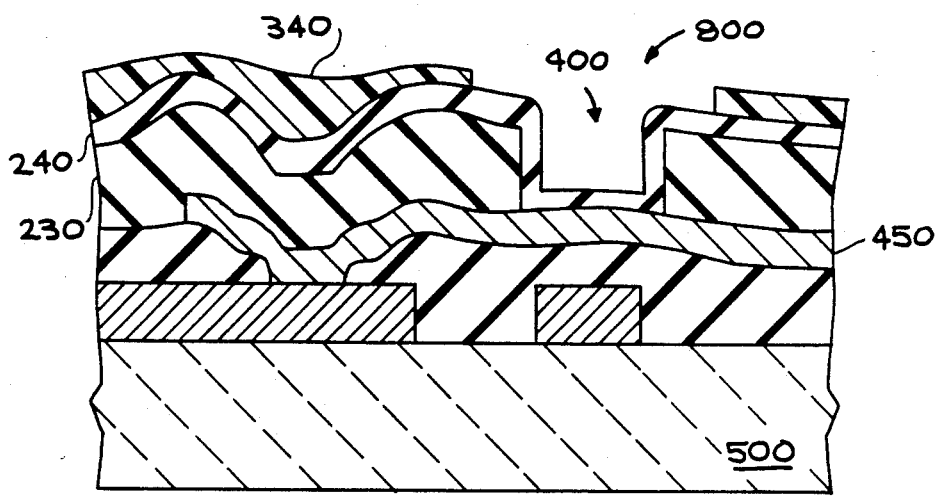
Figure 24:
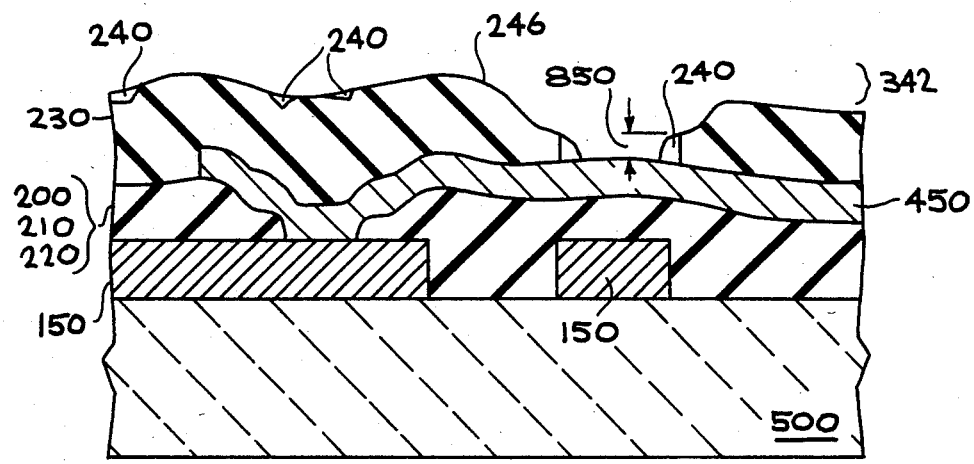

As shown in FIG. 22, a 1.5 micron insulating layer 230 is then deposited and a 2 micron photoresist layer 330 is spun on over layer 230. Vias 400 are defined in photoresist 330 and then etched through layer 230 to conducting layer 450.

Photoresist layer 330 is now removed and another insulating layer 240 of about 0.65 microns is deposited. A 0.6 micron photoresist layer 340 is then spun over layer 240 and an oversize via 800, having a width about 1 micron greater than that of via 400, is defined in photoresist layer 340 to form the structure illustrated in FIG. 23.

Figure 25:
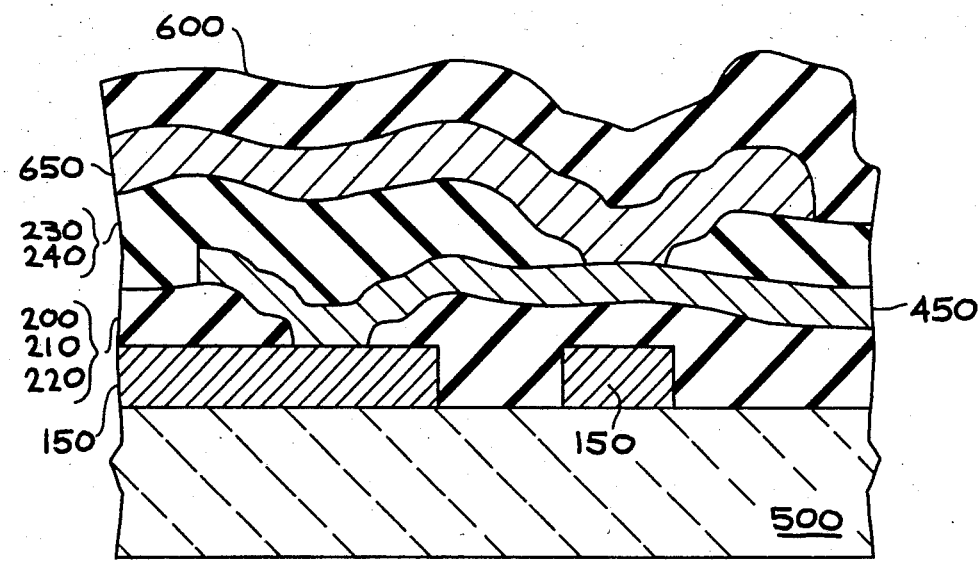

In accordance with the practice of this embodiment of the invention, photoresist layer 340 is then baked at about 185° C. to cause the edges adjacent via 800 to flow to form the desired taper or slope. The structure is then etched using the same etchant as used previously to etch layers 220 and 320 to again etch the insulating layer at a rate of about 1.6 times the etch rate of the photoresist material. The depth of the etch at 342 (from the original surface of photoresist layer 340) is about 2.25 microns. The thickness of the frame of insulating material at 850 is not more than 0.8 microns and provides a safe step. All or most of photoresist layer 340 is removed and the new surface 246 on layer 240 is planarized, all in the same etch step. The structure is again cleaned in a photoresist stripper to remove any residues of photoresist material and another conductive layer 650 is deposited and photolithographically defined using prior art methods. A final passivation layer 600 of insulating material is now applied to provide the final structure as shown in FIG. 25.

The thickness of the insulating material (between wide sections of conductor) between, for example, conductor 150 and the middle conductor 450 is nominally 1.1 microns and may vary from about 0.9 to 1.4 microns. The nominal thickness of the insulating material between, for example, conductors 450 and 650 is 1.5 microns and may vary from about 1.25 to 1.75 microns.

In a preferred embodiment, the frame thickness, i.e., the thickness of the insulating layer between the edge of the narrow via and the bottom of the slope of the larger via, may vary between about 0.3 to 0.8 microns. However, if it is desired to increase the thickness of the insulating material between the conducting layers to further reduce the capacitance between the conductive layers, the nominal frame thickness may be reduced to 0 in an alternate embodiment. The frame thickness may then range from 0.8 to −0.8 microns. With this alternate embodiment, the nominal thicknesses of the respective insulating layers between, for example, conducting layers 150, 450, and 650 may be increased to 4.8 microns, i.e., more than triple the thicknesses usually encountered in the prior art. The resultant capacitances are much less than the capacitances available in the prior art which offers a distinct advantage to this invention. Varying degrees of frame thicknesses between these two embodiments may be chosen depending upon the design requirements for minimum via pitch or minimum capacitance.

As stated previously, the width of the sloped oversized via will vary depending upon the initial angle of the slope of the photoresist layer after baking as well as the initial opening defined in the photoresist layer. As the angle which the slope defines with the horizontal plane of the structure, increases, the overall size of the sloped via will decrease, and vice versa. However, in the practice of this invention, via pitch is not affected because the sloped via is the oversized via. Ideally, the slope will approximate 45 degrees. The slope angle may be controlled by the thickness of the photoresist, the heating temperature and heating time for flowing the photoresist, the flow rate of the particular photoresist material, and the etchant used. When forming the narrow via first, a minimum margin of 1 micron is provided between the outer edge of the narrow via and the bottom of the slope of the sloped oversized via to avoid introducing photoresist material into the narrow via.

Thus, the invention provides an improved method for forming sloped oversized vias for integrated circuit structures which results in improved via pitch, lower capacitance, and the ability to planarize simultaneously while forming the sloped oversized via.

Having thus described the invention, what is claimed is:

1. An improved method for forming a conductive path through at least one layer of insulating material in an integrated circuit structure comprising a narrow portion and a sloped oversized portion, said method comprising:
   (a) forming said sloped oversize portion of said conductive path by defining an opening in a layer of photoresist material applied over said layer of insulating material; and sloping said insulating layer to form said sloped oversized portion of said conductive path; and
   (b) forming said narrow portion of said conductive path by etching at least a portion of said insulating layer to expose a selected section of said integrated circuit structure below said insulating layer.

2. The method of claim 1 wherein said step of sloping said insulating layer to form said oversized portion of said conductive path comprises sloping the edges of said photoresist layer adjacent said opening to define an angle with the plane of said underlying insulating layer and etching said sloped photoresist layer and said insulating layer with an etchant capable of removing both said materials to form said sloped oversized portion of said conductive path.

3. The process of claim 2 wherein said step of sloping said edges of photoresist material adjacent said opening comprises baking said photoresist layer at a temperature sufficient to cause the edges of said photoresist layer adjacent said opening to flow until said edges are smooth to define an angle of from about 30 to 60 degrees with the plane of said underlying insulating layer.

4. The process of claim 3 wherein said baking step is carried out at a temperature of from 100° to 200° C.

5. The process of claim 4 wherein said baking temperature is about 185° C.

6. The process of claim 2 wherein said step of sloping said edges of photoresist material adjacent said opening comprises defocusing the image of said oversized portion during exposure of said photoresist material whereby subsequent development of said photoresist material will result in a sloped edge.

7. The process of claim 1 including the further step of filling said path with a conductive material.

8. The process of claim 7 wherein the step of forming said oversized sloped portion of said conductive path is performed prior to forming said narrow portion of said conductive path.

9. The process of claim 8 including the further step of depositing a further layer of insulating material over said layer after forming said oversized sloped portion of said conductive path and prior to forming said narrow portion of said path whereby underlying segments of said integrated circuit structure exposed by formation of said oversized sloped path will be covered by insulating material prior to forming said narrow path.

10. The process of claim 7 wherein said step of forming said narrow portion of said conductive path is performed prior to the step of forming said oversized sloped portion of said conductive path.

11. The process of claim 1 wherein said step of forming said oversized portion of said conductive path includes selected removal of other portions of said photoresist layer and said underlying insulating layer to planarize said integrated circuit structure simultaneous with formation of said oversized sloped conductive path.

12. An improved method for connecting conductive layers in an integrated circuit structure comprises forming a conductive path and a sloped oversized conductive path in an insulating layer previously formed over a conductive layer by defining an opening in a photoresist layer applied over said insulating layer; sloping said edges of said photoresist layer adjacent said opening to define an angle with the plane of said underlying insulating layer; and etching said photoresist layer and said insulating layer with an etchant capable of removing both materials to form said sloped oversized conductive path.

13. The process of claim 12 wherein said step of etching said photoresist layer and said insulating layer with an etchant comprises etching with an etchant capable of removing both of said materials at an etch rate ratio ranging from about 2:1 to 1:2.

14. The process of claim 12 wherein said sloping step comprises baking said photoresist layer at a temperature sufficient to cause the edges of said photoresist layer adjacent said opening to flow until said edges are smooth to define said angle with the plane of said underlying insulating layer.

15. The process of claim 12 wherein said etching step further comprises removing selected portions of said photoresist layer and said insulating layer to planarize said integrated circuit structure while forming said oversized sloped conductive path.

16. A method for connecting multiple conductive layers on an integrated circuit structure, said method comprising:
 (a) defining a first conductive layer, preselected interconnect pattern, on said integrated circuit structure;
 (b) applying an insulating layer over said first conductive layer;
 (c) forming one or more vias in said insulating layer at preselected locations;
 (d) applying a photoresist layer over said said insulating layer;
 (e) forming one or more oversize vias through said photoresist layer in registry with said vias formed in step c, said oversized vias comprising an opening about 1 micron larger than said underlying vias;
 (f) sloping the edges of said oversized vias to form an angle with said underlying insulating layer;
 (g) etching said photoresist layer and said insulating layer with an etchant capable of etching both materials to form said desired oversized sloped via;
 (h) removing the remainder of said photoresist material; and
 (i) applying a further layer of conductive material over said integrated circuit structure.

17. The process of claim 16 including the further step of applying a further layer of insulating material to said structure after said step of forming said vias and before said step of forming said oversized sloped vias.

18. The process of claim 17 including the step of planarizing said structure while simultaneously forming said oversized sloped vias.

19. The process of claim 16 wherein said step of sloping said edges of said oversized vias comprises exposing said photoresist material to an elevated temperature sufficient to cause said photoresist material adjacent said edges to flow to form an angle of about 30 to 60 degrees with said underlying insulating layer.

20. The process of claim 19 wherein said elevated temperature ranges from 100° to 200° C.

21. The process of claim 19 wherein said etching step comprises etching said photoresist material and said insulating material with an etchant capable of etching both materials at rates of from 1:2 to 2:1 and which will not substantially etch an underlying conductive material.

22. The process of claim 21 wherein said step of applying a further layer of conductive material includes depositing conductive material into said vias, said further layer of conductive material over said integrated circuit structure defining a preselected interconnect pattern.

23. A method for connecting multiple conductive layers on an integrated circuit structure, said method comprising:
 (a) defining a first conductive layer, having a preselected interconnect pattern, on said integrated circuit structure;
 (b) applying a first insulating layer over said first conductive layer;
 (c) applying a photoresist layer over said said insulating layer;
 (d) forming one or more oversize vias through said photoresist layer,
 (e) sloping the edges of said oversized via to form an angle with said underlying insulating layer;
 (f) etching said photoresist layer and said insulating layer with an etchant capable of etching both materials to form said desired oversized sloped via;
 (g) removing the remainder of said photoresist material;
 (h) applying a further layer of insulating material over said oversized sloped via;
 (i) forming a via through said insulating material in registry with said oversized sloped via; and
 (j) applying a further layer of conductive material over said integrated circuit structure.

24. The process of claim 23 wherein said first layer of insulating material on said integrated circuit structure is planarized prior to said step of forming said oversized sloped via.

25. The process of claim 24 wherein planarizing said structure comprises the steps of:
 (a) applying a sacrificial insulating layer over said conductive layer, said sacrificial layer having a thickness less than half the thickness of the narrowest spaces between portions of said underlying conductive layer whereby said sacrificial layer forms trenches in said narrow spaces and does not close on itself while filling said narrow spaces;
 (b) applying a photoresist layer over said sacrificial insulating layer to provide a smooth surface;
 (c) etching said photoresist layer and said sacrificial insulating layer in an etchant which etches both materials at about the same rate to project the smooth surface of said photoresist layer down into said sacrificial insulating layer until said trenches are reduced to a height less than twice their width; and
 (d) removing the remainder of said photoresist layer.

26. The process of claim 25 wherein said etchant for removing said photoresist material and said insulating material comprises a plasma etch using a mixture of oxygen and freon.

27. The process of claim 25 wherein said etchant for removing said photoresist material and said insulating material comprises a plasma etch using a mixture of $CHF_3$ and $SF_6$.

28. The process of claim 25 wherein said etchant for removing said photoresist material and said insulating material etches said insulating material about 1.6 times faster than said photoresist material.

29. The process of claim 23 wherein said first layer of insulating material on said integrated circuit structure is planarized during said step of forming said oversized sloped via.

30. The process of claim 23 wherein said edges of said photoresist are sloped by baking said photoresist at a temperature of about 185° C. for a period of time sufficient to cause said photoresist material to flow to form an angle of about 30 to 60 degrees with the underlying surface.

31. The process of claim 23 wherein said steps are substantially repeated to provide conductive interconnects through a layer of insulating material applied over said further conductive layer to yet another conductive layer on said integrated circuit structure.

32. The process of claim 31 wherein at least one of said conductive interconnects comprises a contact hole to a silicon layer.

33. The process of claim 31 wherein at least one of said conductive interconnects comprises a contact hole to the contact of an active device.

34. The process of claim 23 wherein said insulating material comprises silicon dioxide.

35. The process of claim 23 wherein said conductive material is selected from the class consisting of an aluminum alloy consisting essentially of aluminum and copper, a tungsten alloy consisting essentially of tungsten and titanium, and gold.

36. A method for connecting multiple conductive layers on an integrated circuit structure, said method comprising:
 (a) defining a first conductive layer, having a preselected interconnect pattern, on said integrated circuit structure;
 (b) applying a sacrificial insulating layer over said conductive layer, said sacrificial layer having a thickness less than half the thickness of the narrowest spaces between portions of said underlying conductive layer whereby said sacrificial layer forms trenches in said narrow spaces and does not close on itself while filling said narrow spaces;
 (c) applying a photoresist layer over said sacrificial insulating layer to provide a smooth surface;
 (d) etching said photoresist layer and said sacrificial insulating layer in an etchant which etches both materials at about the same rate to project the smooth surface of said photoresist layer down into said sacrificial insulating layer until said trenches are reduced to a height less than twice their width;
 (e) removing the remainder of said photoresist layer;
 (f) applying a further insulating layer over said first conductive layer;
 (g) applying a photoresist layer over said insulating layer;
 (h) forming one or more oversize vias through said photoresist layer,
 (i) sloping the edges of said oversized via to form an angle with said underlying insulating layer;
 (j) etching said photoresist layer and said insulating layer with an etchant capable of etching both materials to form said desired oversized sloped via;
 (k) removing the remainder of said photoresist material;
 (l) applying a further layer of insulating material over said oversized sloped via;
 (m) forming a via through said insulating material in registry with said oversized sloped via; and
 (n) applying a further layer of conductive material over said integrated circuit structure.

37. The process of claim 36 wherein said steps are substantially repeated to provide conductive interconnects through a layer of insulating material applied over said further conductive layer to yet another conductive layer on said integrated circuit structure.

38. A method for connecting multiple conductive layers on an integrated circuit structure, said method comprising:
 (a) defining a 0.2 to 0.8 micron first conductive layer selected from the class consisting of an aluminum alloy, a tungsten alloy, and gold having a preselected interconnect pattern, on said integrated circuit structure;
 (b) applying a 3.0 micron silicon dioxide first insulating layer over said first conductive layer;
 (c) applying a 3.0 micron photoresist layer over said said insulating layer;
 (d) forming one or more oversize vias through said photoresist layer,
 (e) sloping the edges of said oversized via to form an angle with said underlying insulating layer;
 (f) etching said photoresist layer and said insulating layer to a depth of about 3.65 microns with an etchant capable of etching both materials to form said desired oversized sloped via;
 (g) removing the remainder of said photoresist material;
 (h) applying a 2.45 micron thick further layer of silicon dioxide insulating material over said oversized sloped via;
 (i) forming a via through said insulating material in registry with said oversized sloped via: and
 (j) applying a 0.15 to 0.8 micron thick further layer of conductive material over said integrated circuit structure selected from the class consisting of an aluminum alloy, a tungsten alloy, and gold having a preselected interconnect pattern.

39. The process of claim 38 wherein said steps are substantially repeated to provide conductive interconnects through a layer of insulating material applied over said further conductive layer to yet another conductive layer on said integrated circuit structure.

* * * * *